(12) United States Patent
Nogami et al.

(10) Patent No.: US 8,525,232 B2
(45) Date of Patent: Sep. 3, 2013

(54) SEMICONDUCTOR STRUCTURE HAVING A WETTING LAYER

(75) Inventors: Takeshi Nogami, Schenectady, NY (US); Keith K. H. Wong, Wappingers Falls, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 201 days.

(21) Appl. No.: 13/206,586

(22) Filed: Aug. 10, 2011

(65) Prior Publication Data

US 2013/0037865 A1 Feb. 14, 2013

(51) Int. Cl.
*H01L 29/78* (2006.01)

(52) U.S. Cl.
USPC .......................................... 257/197; 438/596

(58) Field of Classification Search
USPC .................. 257/197, E21.171; 438/259, 596
See application file for complete search history.

(56) References Cited

U.S. PATENT DOCUMENTS

| | | | |
|---|---|---|---|
| 5,940,698 A * | 8/1999 | Gardner et al. | ............... 438/197 |
| 6,527,855 B2 | 3/2003 | DelaRosa et al. | |
| 7,208,361 B2 | 4/2007 | Shah et al. | |
| 7,718,479 B2 | 5/2010 | Kavalieros et al. | |
| 7,737,290 B2 | 6/2010 | Gordon et al. | |
| 7,763,943 B2 | 7/2010 | Pillarisetty et al. | |
| 7,838,356 B2 | 11/2010 | Kirkpatrick et al. | |
| 2007/0210448 A1 | 9/2007 | Wong et al. | |
| 2008/0254232 A1 | 10/2008 | Gordon et al. | |

OTHER PUBLICATIONS

Z. Li et al., "Synthesis and characterization of volatile liquid cobalt amidinates," Dalton Trans., Issue 19, 2008, pp. 2592-2597.
S. W.-K. Choi et al., "Cobalt-Palladium and Cobalt-Platinum Bilayer Films Formed by Chemical Vapor Deposition," Chem. Mater., vol. 9, No. 5, 1997, pp. 1191-1195.

* cited by examiner

*Primary Examiner* — Thomas L Dickey
(74) *Attorney, Agent, or Firm* — Katherine S. Brown

(57) ABSTRACT

A semiconductor structure which includes a semiconductor substrate and a metal gate structure formed in a trench or via on the semiconductor substrate. The metal gate structure includes a gate dielectric; a wetting layer selected from the group consisting of cobalt and nickel on the gate dielectric lining the trench or via and having an oxygen content of no more than about 200 ppm (parts per million) oxygen; and an aluminum layer to fill the remainder of the trench or via. There is also disclosed a method of forming a semiconductor structure in which a wetting layer is formed from cobalt amidinate or nickel amidinate deposited by a chemical vapor deposition process.

20 Claims, 7 Drawing Sheets

SEMICONDUCTOR STRUCTURE HAVING A WETTING LAYER

BACKGROUND

The present invention relates to semiconductor structures and, more particularly, relates to semiconductor structures which include a cobalt or nickel wetting layer prior to the deposition of an aluminum layer.

Advanced metal gate structures for the 22 nm (nanometer) node and beyond may include an aluminum layer. The fabrication of metal gate structures containing aluminum present structural and fabrication difficulties because of aluminum's affinity for oxygen.

These advanced metal gate structures may be fabricated by a replacement gate process. In a replacement gate process, a polysilicon dummy gate is formed and bracketed with spacers and possibly other materials, the polysilicon dummy gate is removed and then replaced with materials that will form the final gate structure.

BRIEF SUMMARY

The various advantages and purposes of the exemplary embodiments as described above and hereafter are achieved by providing, according to a first aspect of the exemplary embodiments, a semiconductor structure which includes a semiconductor substrate and a metal gate structure formed in a trench or via on the semiconductor substrate. The metal gate structure includes a gate dielectric; a wetting layer selected from the group consisting of cobalt and nickel on the gate dielectric lining the trench or via and having an oxygen content of no more than about 200 ppm (parts per million) oxygen; and an aluminum layer to fill the remainder of the trench or via.

According to a second aspect of the exemplary embodiments, there is provided a method of forming a semiconductor structure which includes forming a dummy gate on a semiconductor substrate; forming a spacer on the dummy gate structure; removing the dummy gate to form a trench or via; depositing a gate dielectric in the trench or via; depositing a wetting layer selected from the group consisting of cobalt and nickel to line the trench or via, the wetting layer formed by cobalt amidinate or nickel amidinate deposited by a chemical vapor deposition process; and depositing aluminum to fill the remainder of the trench or via.

According to a third aspect of the exemplary embodiments, there is provided a method of forming a semiconductor structure which includes forming a dummy gate on a semiconductor substrate; forming a spacer on the dummy gate structure; removing the dummy gate to form a trench or via; depositing a gate dielectric in the trench or via; depositing a wetting layer selected from the group consisting of cobalt and nickel to line the trench or via, the wetting layer having an oxygen content of no more than about 200 ppm (parts per million) oxygen and formed by cobalt amidinate or nickel amidinate deposited by a chemical vapor deposition process wherein the cobalt amidinate or nickel amidinate has the formula [M(AMD)2], and the structure

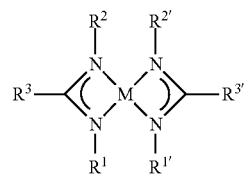

in which M is cobalt or nickel, R1, R2, R3, R1', R2' and R3' may be chosen independently from hydrogen, alkyl, aryl, alkenyl, alkynyl, trialkylsilyl or fluoroalkyl groups or other non-metal atoms or groups; and depositing aluminum directly on the wetting layer to fill the remainder of the trench or via.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 2A to 2M are cross-sectional views illustrating a process for fabricating the exemplary embodiments in which:

FIG. 2A illustrates the formation of dummy gates;

FIG. 2B illustrates the deposition of spacer material followed by an etching process;

FIG. 2C illustrates the spacers formed after the etching process in FIG. 2B;

FIG. 2D illustrates the deposition of stress liners;

FIG. 2E illustrates the deposition of a planarizing layer;

FIG. 2F illustrates the planarization of the semiconductor structure;

FIG. 2G illustrates the removal of the dummy gates followed by deposition of a gate dielectric and a PFET work function metal;

FIG. 2H illustrates the deposition of a blocking material over the PFET structure;

FIG. 2I illustrates the removal of the PFET work function metal in the NFET structure;

FIG. 2J illustrates the removal of the blocking material and the deposition of the NFET work function metal;

FIG. 2K illustrates the deposition of the cobalt or nickel wetting layer;

FIG. 2L illustrates the deposition of aluminum; and

FIG. 2M illustrates the planarization of the semiconductor structure.

DETAILED DESCRIPTION

It is proposed to utilize a chemical vapor deposited (CVD) cobalt or nickel wetting layer in advanced metal gate structures. In a replacement gate device, aluminum is used as the conductor metal because of the low resistivity. Making a void-free aluminum fill for the advanced gate device is very challenging due to the small opening dimension and high aspect ratio of the gate after the work function, barrier and other layers may be deposited. A thin and continuous wetting layer is preferred to be deposited before the aluminum deposition. The wetting layer facilitates the aluminum to reflow into the gate. Aluminum reflow is usually done by keeping the wafer at an elevated temperature during and after the aluminum deposition. Aluminum deposition may be done by a combination of chemical vapor deposition (CVD) and physical vapor deposition (PVD). A desirable wetting layer should have a high affinity with aluminum and should be as thin as possible to allow more room for the aluminum to reflow into the gate. The wetting layer should also have as low oxygen content as possible since aluminum is easily reacted with oxygen forming a resistive aluminum oxide layer, causing a high DC and AC contact resistance to the gate. Low oxygen content in the wetting layer is further preferable as the aluminum oxide layer will impede the subsequent reflow resulting in poor filling of the aluminum fill or voids in the aluminum fill.

Figure 1:
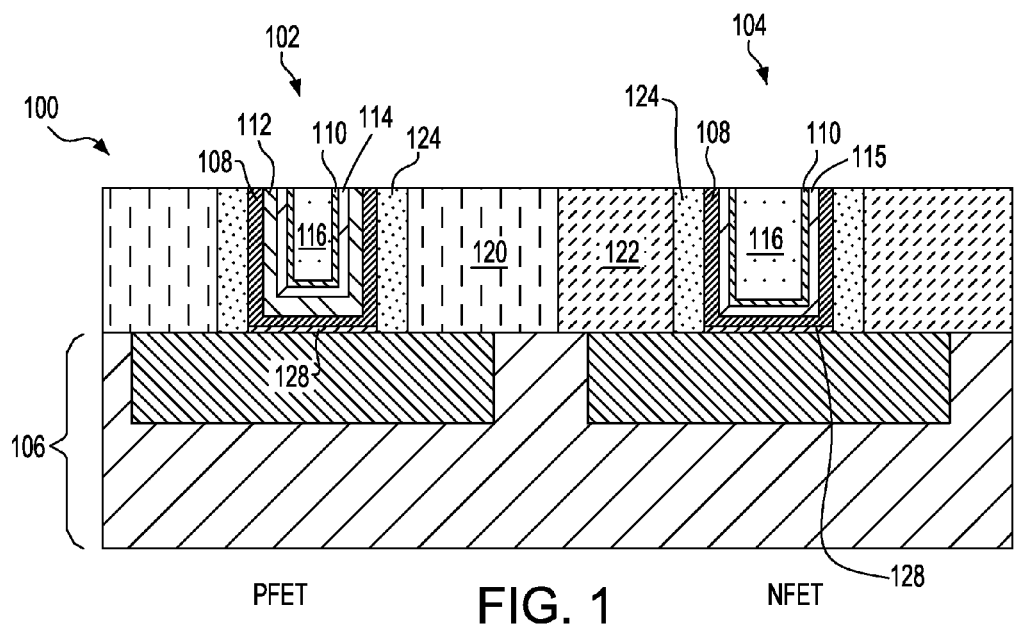
FIG. 1 is a cross-sectional view of an exemplary embodiment of a semiconductor structure which includes a plurality of semiconductor devices having a wetting layer.

Referring to the Figures in more detail, and particularly referring to FIG. 1, there is shown a semiconductor structure 100 which includes a plurality of semiconductor devices 102, 104 formed on a conventional semiconductor substrate 106. For purposes of illustration and not limitation, the semiconductor device 102 may be a p type field effect transistor (PFET) and the semiconductor device 104 may be an n type field effect transistor (NFET).

The semiconductor substrate 106 may be a bulk semiconductor substrate or a semiconductor on insulator substrate. The semiconductor material making up the semiconductor substrate 106 may be any semiconductor material, including but not limited to, silicon, silicon germanium, germanium, a III-V compound semiconductor, or a II-VI compound semiconductor.

Each of the semiconductor devices 102, 104, has a trench or via that includes a gate dielectric layer 108 and a wetting layer 110. The gate dielectric layer 108 may have a thickness of about 16 to 22 angstroms. The gate dielectric layer may be selected from any conventional gate dielectric material and may include a high dielectric constant (i.e., high-k) material. There may also be an interfacial layer 128. The semiconductor devices 102, 104 may each have spacers 124.

The PFET device 102 may have a compressive stress liner 120 while the NFET device 104 may have a tensile stress liner 122.

The wetting layer 110, which may be cobalt or nickel, may line the trench or via and may have a thickness of about 5 to 20 angstroms. The wetting layer 110 is deposited such that it is oxygen free meaning that there is little or no residual oxygen or oxide contained in the cobalt layer 110. It is most preferred that the maximum oxygen content of the wetting layer 110 should be about 200 parts per million (ppm) or less.

Between the gate dielectric layer 108 and the wetting layer 110 may be a metallic layer which may be a workfunction metal. The workfunction metal for the PFET device 102 should be different from the workfunction metal for the NFET device 104. For the PFET device 102, the workfunction metal may include a dual layer comprising a first layer 112 selected from the group consisting of titanium nitride, ruthenium and tantalum nitride and a second layer 114 selected from the group consisting of tantalum carbide and titanium aluminum. For the NFET device 104, the workfunction metal 115 may include a metal selected from the group consisting of tantalum carbide and titanium aluminum.

It is preferred that the wetting layer 110 is formed directly on the workfunction metal in both PFET and NFET devices 102, 104.

On top of the wetting layer 110 is deposited an aluminum layer 116 which fills the trench or via in each of the devices 102, 104. In a preferred exemplary embodiment, the aluminum layer 116 is PVD aluminum and is deposited directly on the cobalt layer 110.

In another exemplary embodiment, which is not as preferred, the aluminum layer 116 may include a first CVD aluminum layer deposited directly on the wetting layer 110 followed by a PVD aluminum layer deposited on the CVD aluminum layer. This exemplary embodiment is not as preferred because of the extra cost of depositing the CVD aluminum layer but the cost can be reduced significantly by making the CVD aluminum layer thinner.

Referring now to FIGS. 2A to 2M, there is described a process for fabricating the semiconductor structure of FIG. 1. On the left side of FIGS. 2A to 2M, a PFET device may be fabricated while an NFET device may be fabricated on the right side of FIGS. 2A to 2M.

Figure 2A:
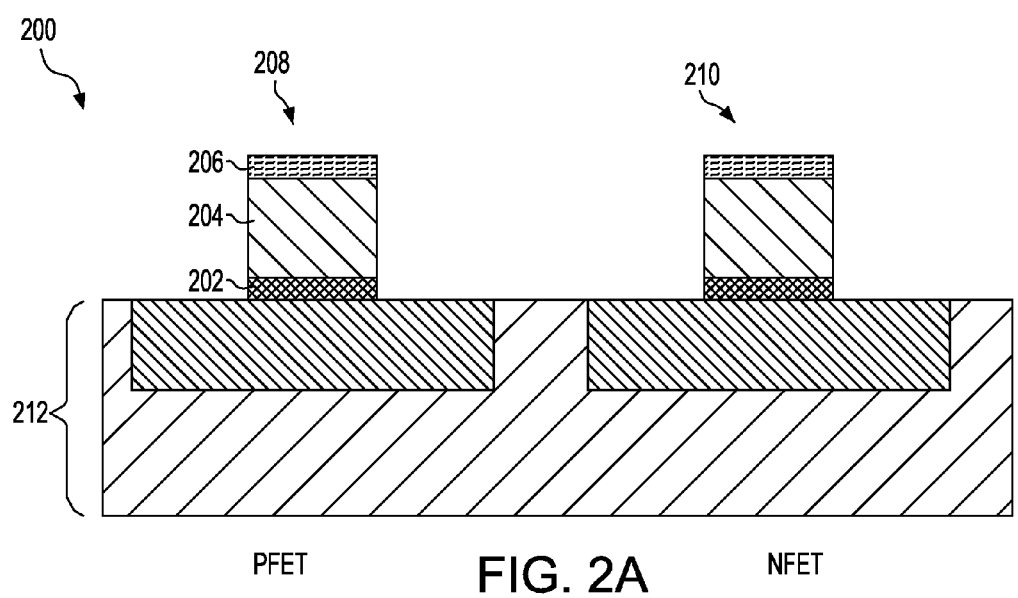

Referring first to FIG. 2A, blanket layers of oxide, polysilicon and nitride may be conventionally deposited and patterned to form dummy gates 208, 210 including oxide 202, polysilicon 204 and nitride 206 on semiconductor substrate 212 of semiconductor structure 200. These dummy gates 208, 210 will be replaced in a later process step by replacement gates.

Figure 2B:
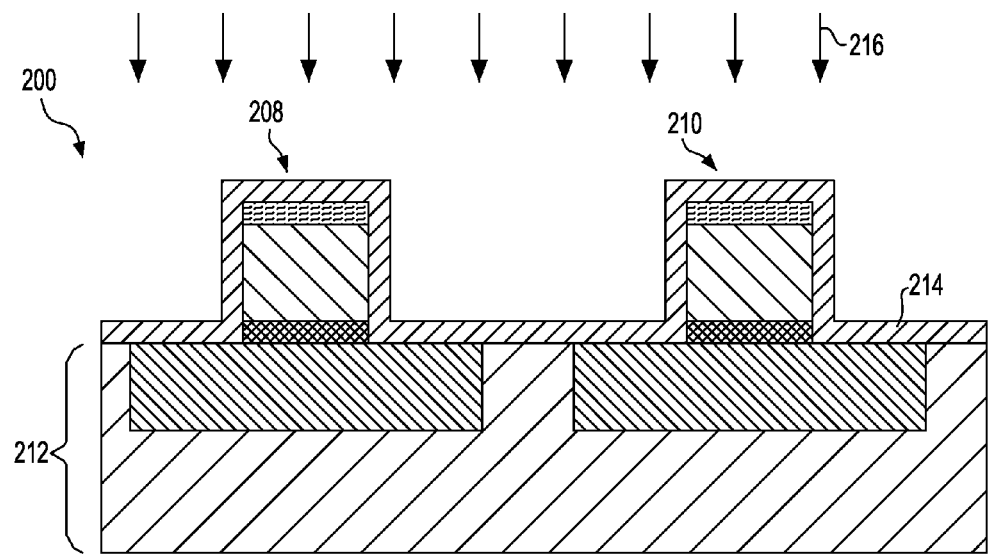
Figure 2C:
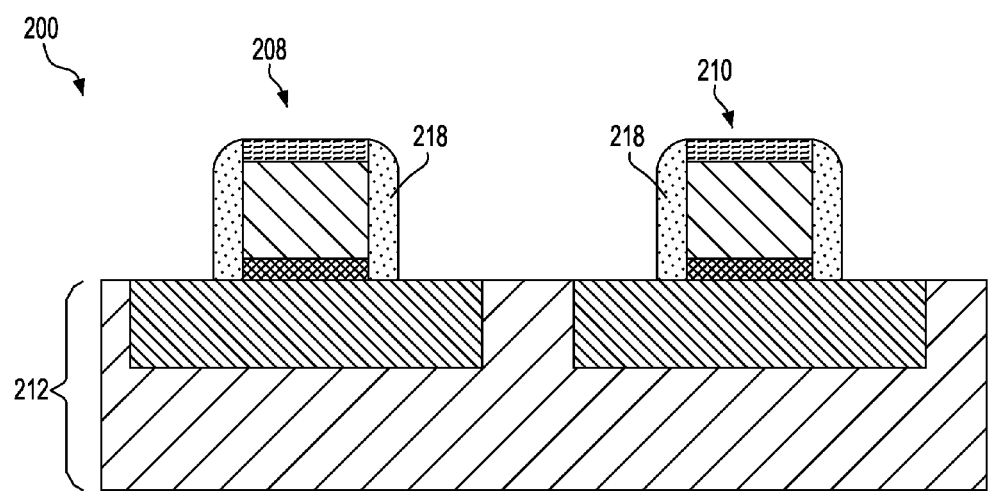

Referring now to FIG. 2B, spacer material 214 has been deposited to cover dummy gates 208, 210. The spacer material 214 is a conventional spacer material such as an oxide or a nitride. Thereafter, the semiconductor structure 200 may undergo an etching process to define the spacers on dummy gates 208, 210. A dry etch process, such as reactive ion etching indicated by arrows 216, is preferred to define the spacers. After the dry etching process, spacers 218 have been defined and are shown in FIG. 2C.

Figure 2D:
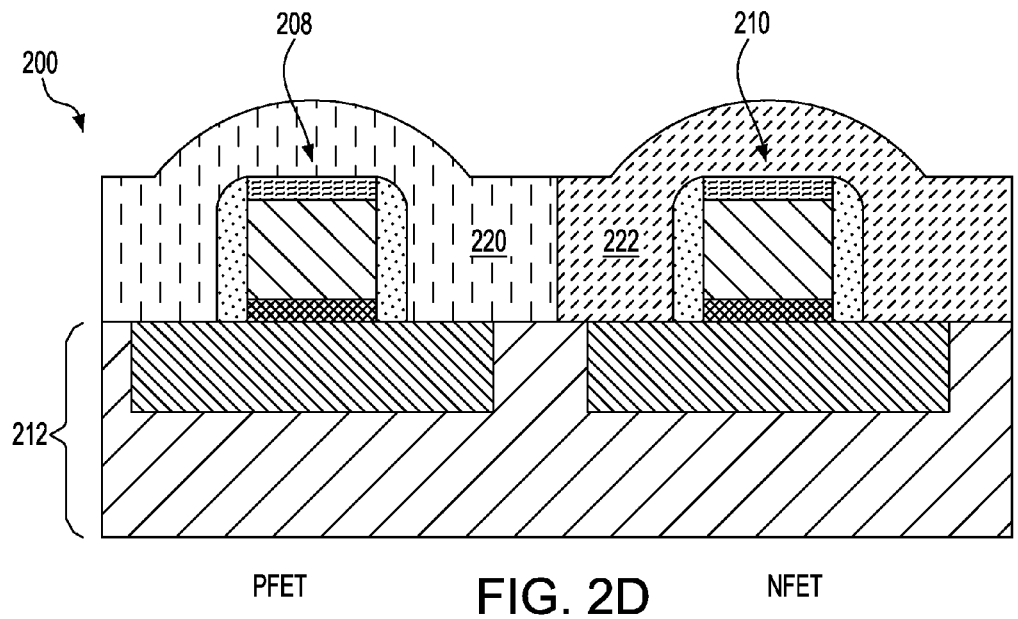

As shown in FIG. 2D, stress liners 220, 222 have been conventionally deposited on dummy gates 208, 210, respectively. Stress liner 220 may be a compressive liner for a PFET device to be fabricated while stress liner 222 may be a tensile liner for an NFET device to be fabricated.

Figure 2E:
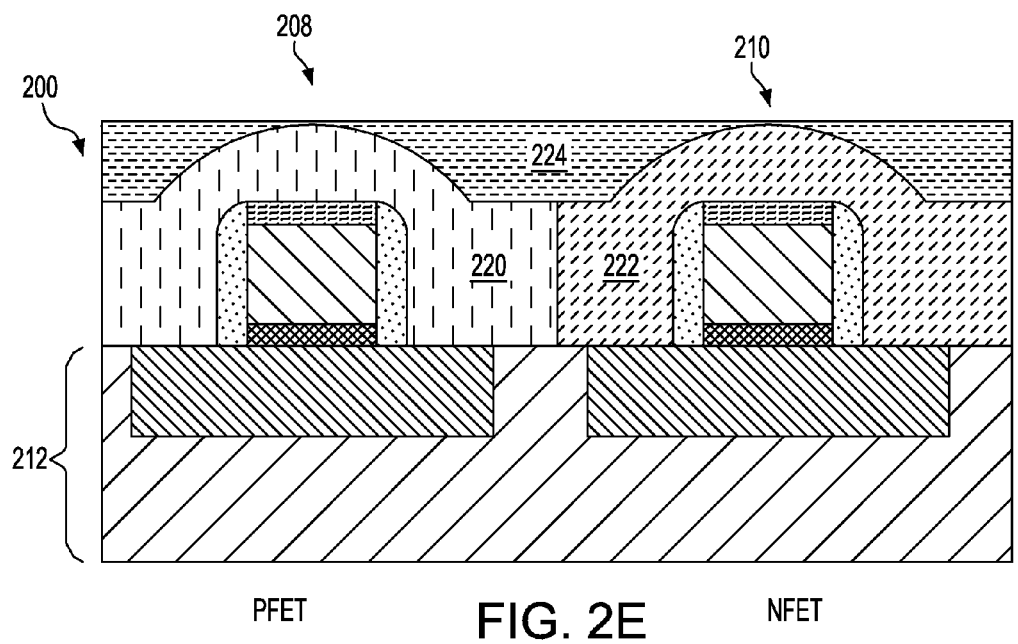

A layer of silicon nitride or silicon oxide 224 may then be deposited as shown in FIG. 2E to assist in the planarizing of the semiconductor structure 200 in a subsequent process step.

Figure 2F:
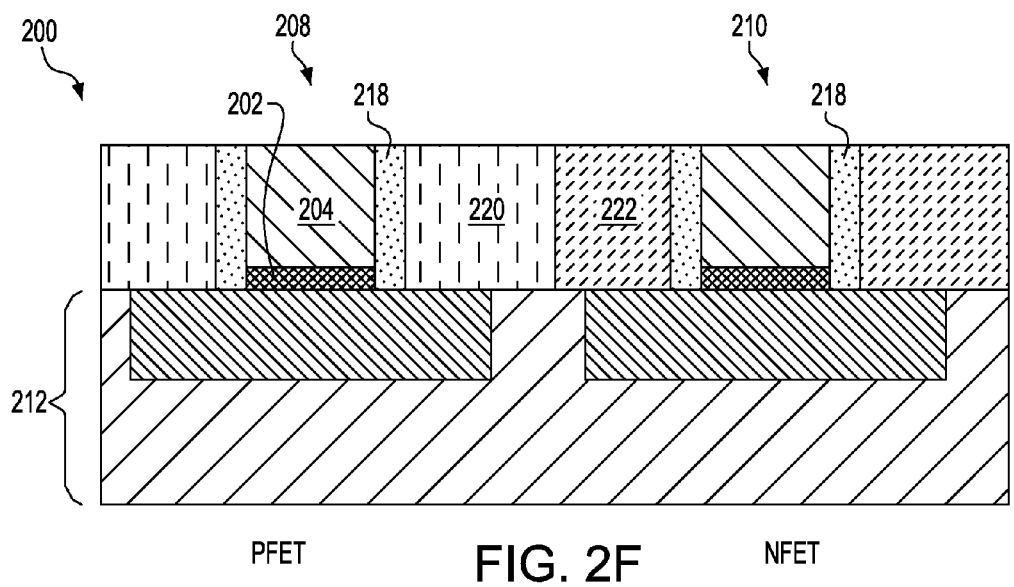

Thereafter, the semiconductor structure 200 may be planarized by a process such as chemical mechanical polishing (CMP). The CMP process also exposes the polysilicon of the dummy gates 208, 210 as shown in FIG. 2F.

The polysilicon 204 and oxide 202 that form the dummy gates 208, 210 are removed by conventional wet or dry etching to leave empty trenches or vias. For example, TMAH or ammonia may be used if wet etching and reactive ion etching (RIE) if dry etching is used.

Figure 2G:
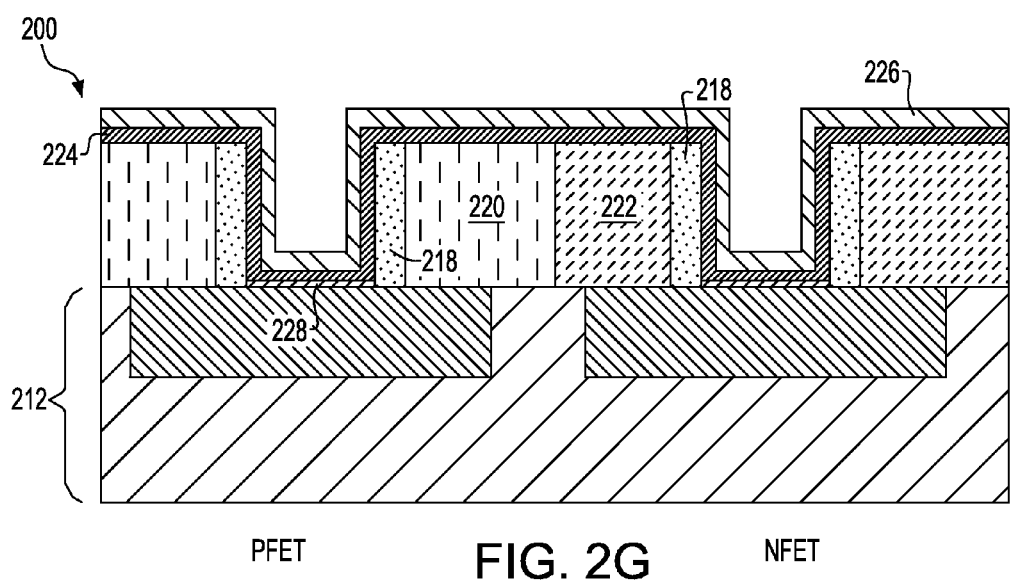
Figure 2H:
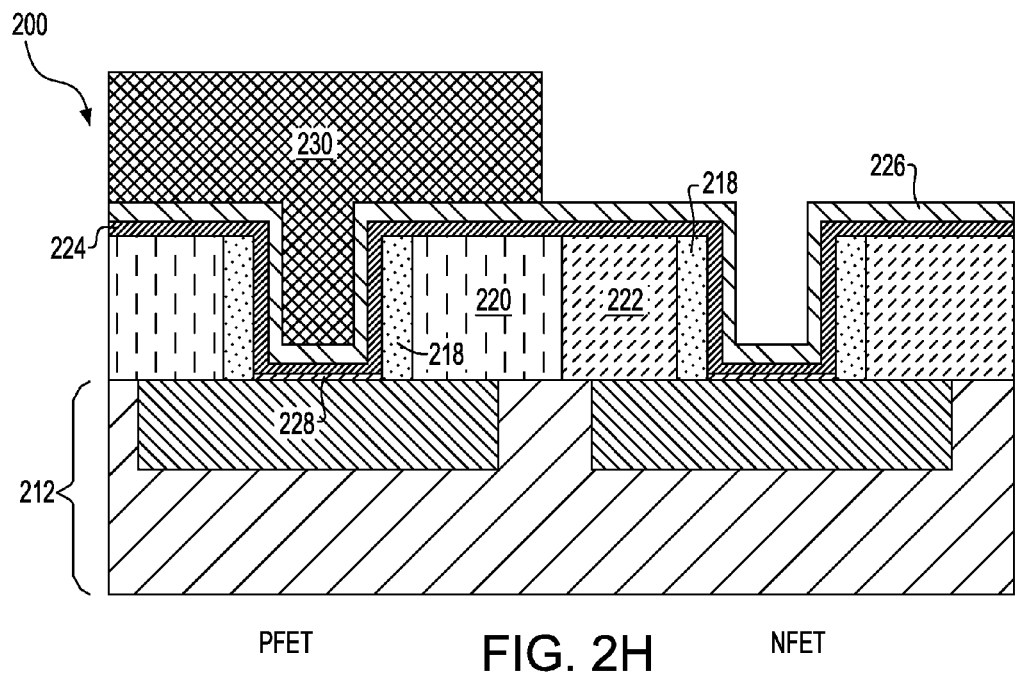
Figure 2I:
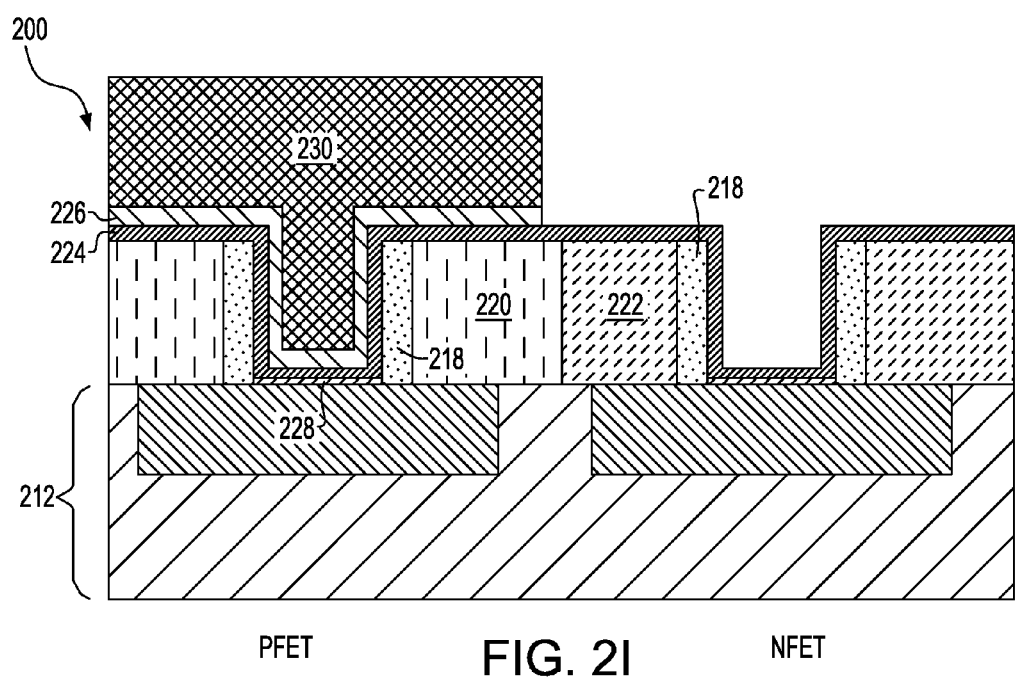

The replacement gate process may begin by depositing or forming an interlayer oxide at the bottom of the trench or via followed by depositing a gate dielectric and preferably a work function metal. Referring now to FIG. 2G, a thin interlayer oxide 228, gate dielectric 224 and PFET work function metal 226 have been deposited on both the PFET and NFET sides of the semiconductor structure 200. The gate dielectric 224 may be any suitable dielectric material but is preferably a high dielectric constant (high-k) gate dielectric. The PFET work function metal 226 may be, for example, titanium nitride, ruthenium or tantalum nitride Referring now to FIG. 2H, the PFET side of the semiconductor structure is blocked with a conventional photo mask 230 and then in FIG. 2I, the PFET work function metal 226 may be removed from the NFET side of the semiconductor structure 200. The PFET work function metal 226 may be conventionally removed by RIE or wet etching.

Figure 2J:
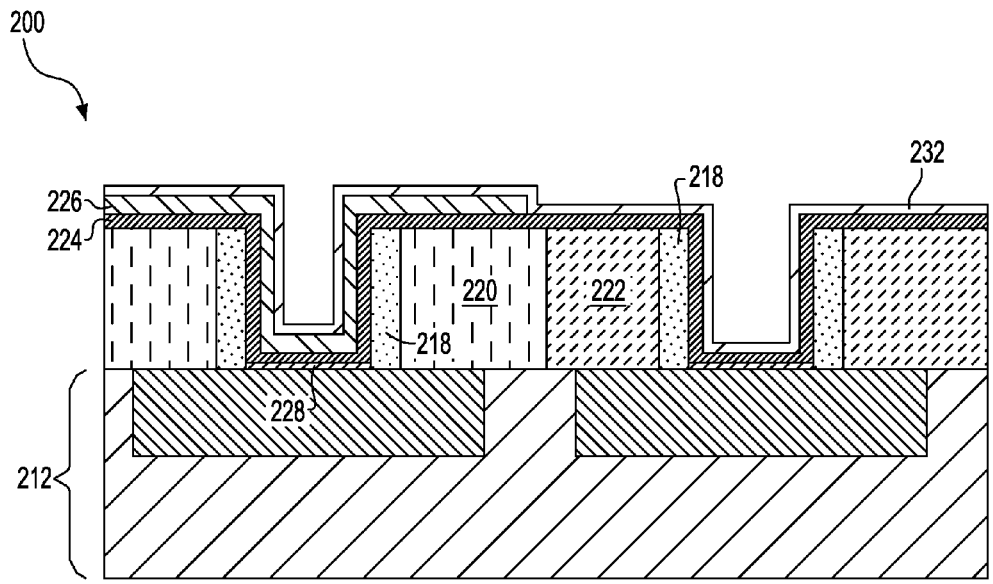

The photo mask 230 is stripped and then an NFET work function metal 232 is blanket deposited as shown in FIG. 2J. The NFET work functional metal 232 may be, for example, tantalum carbide or titanium aluminum.

Figure 2K:
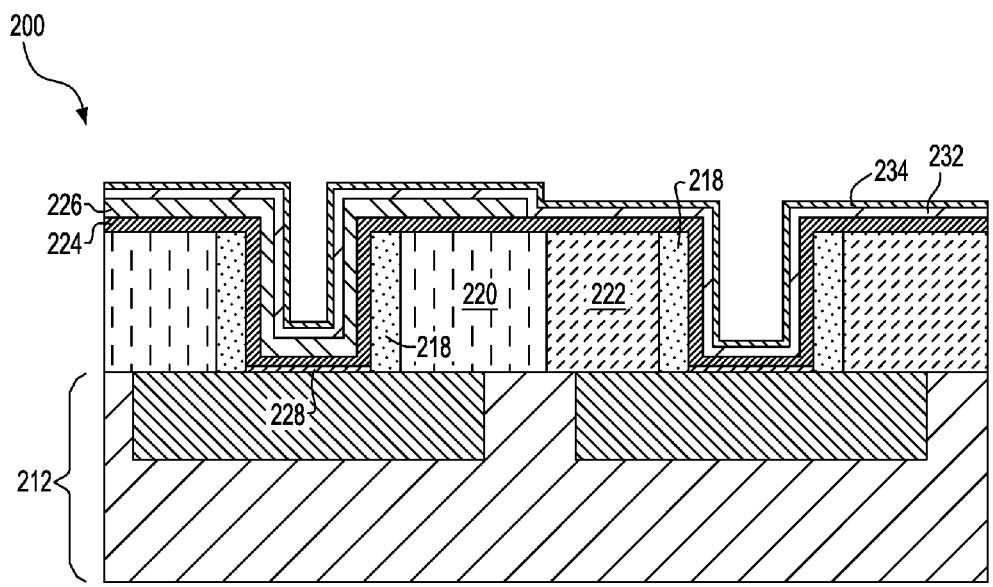

Referring now to FIG. 2K, a thin, substantially oxygen-free wetting layer 234 of cobalt or nickel is formed over the entire semiconductor structure 200 so as to be in contact with the NFET work function metal layer 232 which is on both the PFET and NFET side of the semiconductor structure 200. The wetting layer 234 may have a thickness of about 5 to 20 angstroms. The wetting layer 234 is deposited such that it is substantially oxygen-free meaning that there is little or no residual oxygen or oxide contained in the wetting layer 234. The maximum oxygen contained in the wetting layer 234 should only be about 200 parts per million (ppm).

By forming a substantially oxygen-free wetting layer 234, a subsequent layer of PVD aluminum may be deposited without degrading the PVD aluminum layer.

It is preferred that the wetting layer 234 be formed by a thermal CVD process using a cobalt amidinate or nickel amidinate. The cobalt amidinate or nickel amidinate may have the formula [M(AMD)2], and the structure

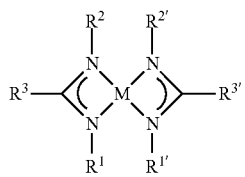

in which M is cobalt or nickel, R1, R2, R3, R1', R2' and R3' may be chosen independently from hydrogen, alkyl, aryl, alkenyl, alkynyl, trialkylsilyl or fluoroalkyl groups or other non-metal atoms or groups. In an exemplary embodiment, R1, R3, R2', R3' may be ethyl groups and R1', R2 may be t-butyl groups.

The thermal CVD deposition process includes using a cobalt amidinate or a nickel amidinate in a carrier gas such as argon or helium plus hydrogen at a substrate temperature between 220-260° C. and at a pressure of about 0.05-0.15 Torr. The hydrogen reacts with the cobalt amidinate or nickel amidinate to deposit the cobalt or nickel wetting layer 234. Byproducts of the reaction are carried away by the carrier gas. Specific thermal reaction conditions may be fine tuned for the specific cobalt amidinate or nickel amidinate used. Generally, the choice of amidinate is based on the reactivity of the precursor with hydrogen, its vapor pressure and chemical stability.

Figure 2L:
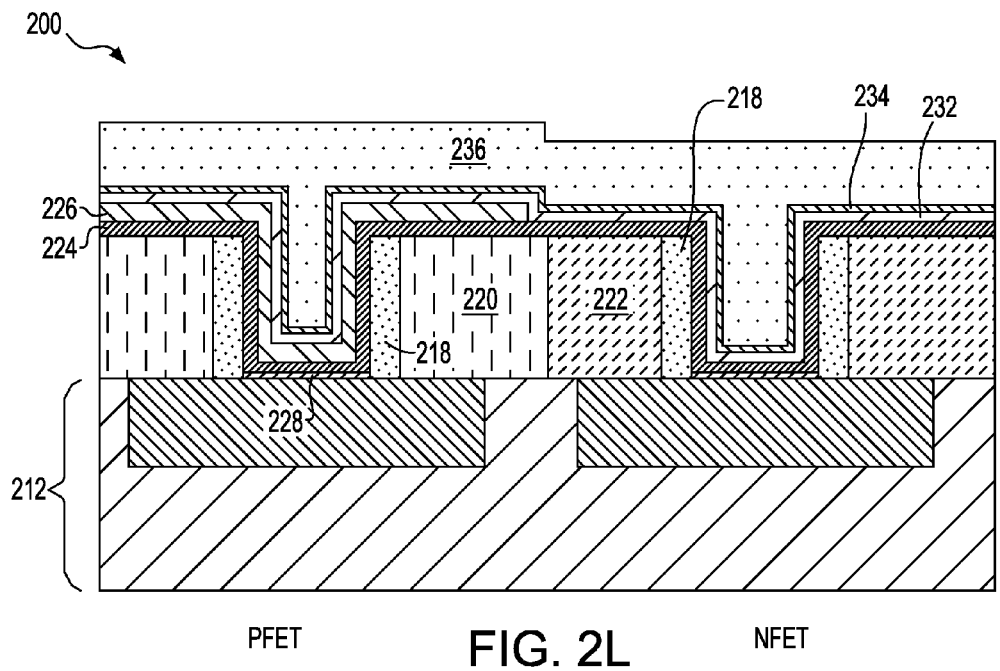

Referring now to FIG. 2L, an aluminum layer 236 may be deposited which fills the remainder of the trenches or vias. The aluminum layer 236 preferably is a PVD aluminum layer in which the aluminum is deposited to a desired thickness on the semiconductor structure 200 which is either heated to about 400 to 500° C. or kept at a lower temperature (for example, room temperature to about 200° C.) during deposition of the aluminum and then reflowed at about 400 to 500° C. for a few minutes to enable the aluminum to flow into the trenches or vias. Although not as preferred, prior to forming the PVD aluminum layer, there may be a layer of CVD aluminum deposited directly on the wetting layer 234. PVD aluminum may be deposited quicker but since CVD aluminum is a conformal process, it may be desirable to deposit CVD aluminum first to fill small features and then finish with PVD aluminum. For purposes of illustration and not limitation, CVD aluminum first may be deposited to a thickness of about 250 to 1000 angstroms and PVD aluminum may be then deposited to a thickness of about 1000 angstroms to 3000 angstroms.

Figure 2M:
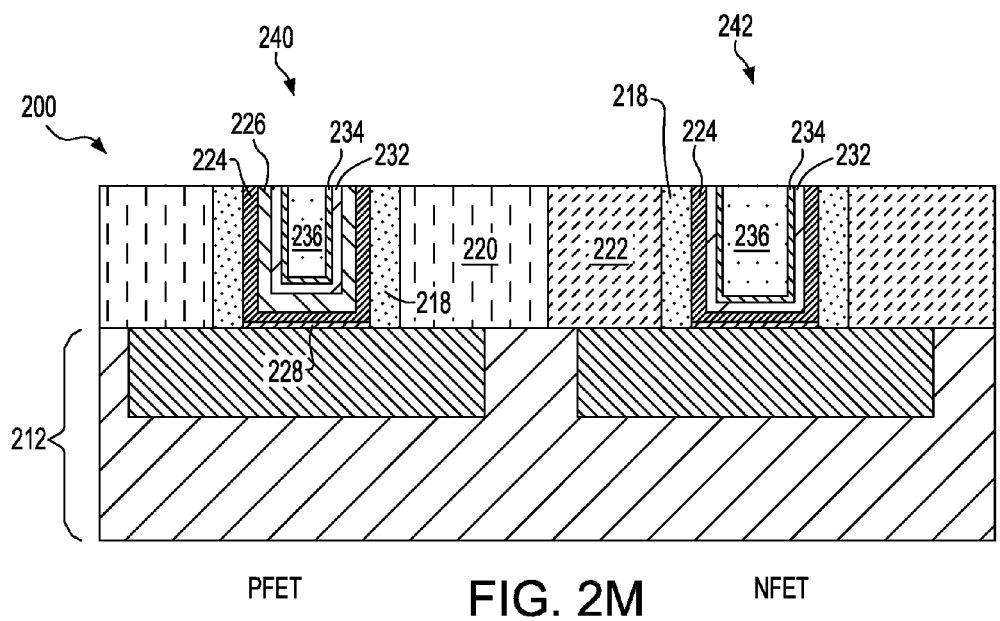

Referring now to FIG. 2M, the semiconductor structure 200 is conventionally planarized to remove the overburden of metal and dielectric layers to result in semiconductor devices 240, 242.

Subsequently, the semiconductor structure 200 would undergo conventional semiconductor middle of the line and back end of the line processing to form semiconductor devices on the semiconductor substrate 212.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A semiconductor structure comprising:
    a semiconductor substrate; and
    a metal gate structure formed in a trench or via on the semiconductor substrate, the metal gate structure comprising:
        a gate dielectric;
        a wetting layer selected from the group consisting of cobalt and nickel on the gate dielectric lining the trench or via and having an oxygen content of no more than about 200 ppm (parts per million) oxygen; and
        an aluminum layer to fill the remainder of the trench or via.

2. The semiconductor structure of claim 1 wherein the wetting layer is oxygen free.

3. The semiconductor structure of claim 1 wherein the wetting layer has a thickness of 5 to 20 angstroms.

4. The semiconductor structure of claim 1 further comprising a metallic layer between the gate dielectric and the wetting layer.

5. The semiconductor structure of claim 4 wherein the metallic layer is a workfunction metal and the semiconductor structure is a PFET, the workfunction metal including a dual layer comprising a first layer selected from the group consisting of titanium nitride, ruthenium and tantalum nitride and a second layer selected from the group consisting of tantalum carbide and titanium aluminum.

6. The semiconductor structure of claim 5 wherein the wetting layer is directly on the second layer of the workfunction metal.

7. The semiconductor structure of claim 4 wherein the metallic layer is a workfunction metal and the semiconductor structure is an NFET, the workfunction metal selected from the group consisting of tantalum carbide and titanium aluminum.

8. The semiconductor structure of claim 7 wherein the wetting layer is directly on the workfunction metal.

9. A method of forming a semiconductor structure comprising:
    forming a dummy gate on a semiconductor substrate;
    forming a spacer on the dummy gate structure;
    removing the dummy gate to form a trench or via;
    depositing a gate dielectric in the trench or via;
    depositing a wetting layer selected from the group consisting of cobalt and nickel to line the trench or via, the wetting layer formed by cobalt amidinate or nickel amidinate deposited by a chemical vapor deposition process; and
    depositing aluminum to fill the remainder of the trench or via.

10. The method of claim 9 wherein the cobalt amidinate or nickel amidinate has the formula [M(AMD)2], and the structure

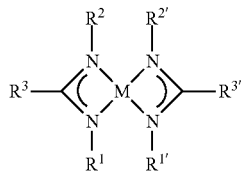

in which M is cobalt or nickel, R1, R2, R3, R1', R2' and R3' may be chosen independently from hydrogen, alkyl, aryl, alkenyl, alkynyl, trialkylsilyl or fluoroalkyl groups or other non-metal atoms or groups.

11. The method of claim 9 wherein the wetting layer has an oxygen content of no more than about 200 ppm (parts per million) oxygen.

12. The method of claim 9 wherein the wetting layer is oxygen free.

13. The method of claim 9 wherein depositing aluminum comprises depositing aluminum by a physical vapor deposition process.

14. The method of claim 13 wherein the aluminum is deposited directly on the wetting layer.

15. The method of claim 9 wherein depositing aluminum comprises depositing aluminum by a chemical vapor deposition process followed by depositing aluminum by a physical vapor deposition process.

16. The method of claim 9 wherein between depositing a gate dielectric and depositing a cobalt layer, further comprising depositing a metallic layer wherein the metallic layer is a workfunction metal and the semiconductor structure is a PFET, the workfunction metal including a dual layer comprising a first layer selected from the group consisting of titanium nitride, ruthenium and tantalum nitride and a second layer selected from the group consisting of tantalum carbide and titanium aluminum.

17. The method of claim 16 wherein depositing a wetting layer includes depositing a wetting layer directly on the second layer.

18. The method of claim 9 wherein between depositing a gate dielectric and depositing a wetting layer, further comprising depositing a metallic layer wherein the metallic layer is a workfunction metal and the semiconductor structure is an NFET, the workfunction metal selected from the group consisting of tantalum carbide and titanium aluminum.

19. The method of claim 18 wherein depositing a wetting layer includes depositing a wetting layer directly on the workfunction metal.

20. A method of forming a semiconductor structure comprising:
    forming a dummy gate on a semiconductor substrate;
    forming a spacer on the dummy gate structure;
    removing the dummy gate to form a trench or via;
    depositing a gate dielectric in the trench or via;
    depositing a wetting layer selected from the group consisting of cobalt and nickel to line the trench or via, the wetting layer having an oxygen content of no more than about 200 ppm (parts per million) oxygen and formed by depositing cobalt amidinate or nickel amidinate by a chemical vapor deposition process wherein the cobalt amidinate or nickel amidinate has the formula M(AMD)2], and the structure

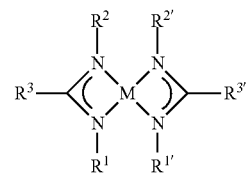

in which M is cobalt or nickel, R1, R2, R3, R1', R2' and R3' may be chosen independently from hydrogen, alkyl, aryl, alkenyl, alkynyl, trialkylsilyl or fluoroalkyl groups or other non-metal atoms or groups; and
    depositing aluminum directly on the wetting layer to fill the remainder of the trench or via.

* * * * *